US008788989B2

(12) United States Patent
Eng

(10) Patent No.: US 8,788,989 B2
(45) Date of Patent: *Jul. 22, 2014

(54) DEVELOPING A HARDWARE DESCRIPTION WHICH PERFORMS A FUNCTION BY PARTIAL HARDENING OF A SOFTWARE PROGRAM ON A MULTI-PROCESSOR SYSTEM

(71) Applicant: Coherent Logix, Incorporated, Austin, TX (US)

(72) Inventor: Tommy K. Eng, Pleasanton, CA (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/862,842

(22) Filed: Apr. 15, 2013

(65) Prior Publication Data

US 2013/0283220 A1 Oct. 24, 2013

Related U.S. Application Data

(63) Continuation of application No. 13/431,029, filed on Mar. 27, 2012, now Pat. No. 8,438,510, which is a continuation of application No. 13/110,248, filed on May 18, 2011, now Pat. No. 8,171,436, which is a continuation of application No. 12/837,767, filed on Jul. 16, 2010, now Pat. No. 7,949,969, which is a continuation of application No. 11/751,994, filed on May 22, 2007, now Pat. No. 7,761,817.

(60) Provisional application No. 60/802,629, filed on May 22, 2006.

(51) Int. Cl.
*G06F 17/50* (2006.01)

(52) U.S. Cl.
USPC ........... 716/102; 716/100; 716/104; 716/116; 716/117

(58) Field of Classification Search
CPC ................ G06F 17/5045; G06F 17/175022; G06F 17/5068; G06F 17/505; G06F 17/5054; G06F 17/5036; G06F 17/5072; G06F 17/5027; G06F 15/7867
USPC .......................... 716/100, 102, 104, 116, 117
See application file for complete search history.

(56) References Cited

U.S. PATENT DOCUMENTS 6,226,776 B1 5/2001 Panchul et al.
6,466,898 B1 10/2002 Chan
(Continued)

OTHER PUBLICATIONS

Sun et al., "Syntheis of Custom Processors Based on Extensible Platforms," IEEE/ACM International Conference on Computer Aided Design 2002, IEEE/ACM Digest of Technical Papers, San Jose, CA, Nov. 10-14, 2002, pp. 641-648.
(Continued)

*Primary Examiner* — Stacy Whitmore
*Assistant Examiner* — Magid Dimyan
(74) *Attorney, Agent, or Firm* — Meyertons Hood Kivlin Kowert & Goetzel, P.C.; Jeffrey C. Hood

(57) ABSTRACT

System and method for developing an ASIC. A software program may be stored which includes program instructions which implement a function. The software program may be executed on a processing system at a desired system speed and may be validated based on the execution. A first hardware description of at least a portion of the processing system may be stored and may specify implementation of at least a portion of the processing system. A second hardware description may be generated that corresponds to a first portion of the first hardware description. The second hardware description may specify a dedicated hardware implementation of a first portion of the software program executing on the processing system. Generation of the second hardware description may be performed one or more times to fully specify the ASIC. An ASIC may be created which implements the function of the software program.

31 Claims, 4 Drawing Sheets

(56) References Cited

U.S. PATENT DOCUMENTS

| | | | |
|---|---|---|---|
| 6,708,325 | B2 | 3/2004 | Cooke et al. |
| 6,981,232 | B1 | 12/2005 | Lien et al. |
| 6,990,641 | B2 | 1/2006 | Tamai |
| 7,000,092 | B2 | 2/2006 | Gehman et al. |
| 7,437,500 | B2 | 10/2008 | Butt et al. |
| 8,171,436 | B2 | 5/2012 | Eng |
| 2003/0149859 | A1 | 8/2003 | Hyduke |
| 2004/0030859 | A1 | 2/2004 | Doerr et al. |
| 2006/0161877 | A1 | 7/2006 | Hamada et al. |
| 2007/0226686 | A1 | 9/2007 | Beardslee et al. |
| 2007/0239966 | A1 | 10/2007 | Georgiou et al. |
| 2009/0055781 | A1 | 2/2009 | Araya |
| 2010/0175038 | A1 | 7/2010 | Hopkins et al. |

OTHER PUBLICATIONS

Parker, "A Component-Based Architecture for Parallel Multi-Physics PDE Simulation," Future Generations Computer Systems, Elsevier Science Publishers, vol. 22, No. 1-2, 2006, pp. 204-216.

Agarwal et al., "The MIT Alewife Machine," Proceedings of the IEEE, vol. 87, No. 3, Mar. 1999, pp. 430-444.

Houzet et al., "A Shared Memory Model on a Cluster of PCs," Microprocessors and Microsystems, IPC Business Press Ltd. London, vol. 23, No. 3, Oct. 1, 1999, pp. 125-134.

Kimelman et al., "Visualizing the Execution of High Performance Fortran (HPF) Programs," Proceedings of the 9th International Parallel Processing Symposium, Santa Barbara, CA, Apr. 25-28, 1995, IEEE Computer Society, Los Alamitos, CA, Apr. 25, 1995, pp. 750-759.

Burns, "An Architecture for Verilog Hardware Accelerator," Verilog HDL Conference, IEEE, Feb. 26, 1996, pp. 2-11, XP010159444.

Radhakrishnan et al., "External Adjustment of Runtime Parameters in Time Warp Synchronized Parallel Simulators," Parallel Processing Symposium, Apr. 1, 1997, pp. 260-266, XP010216791.

Gonzalez, "Xtensa: A Configurable and Extensible Processor," IEEE Micro, IEEE Service Center, Los Alamitos, CA, US, vol. 20, No. 2, Mar. 2000, pp. 60-70.

Hutton et al., "A Methodology for FPGA to Structured-ASIC Synthesis and Verification," Design, Automation, and Test in Europe, 2006, Proceedings Munich, Germany, Mar. 6-10, 2006, Piscataway, New Jersey, Mar. 6, 2006, pp. 1-6.

Singh et al., "SoC Synthesis with automatic hardware software interface generation," VLSI Design, 2003, Proceedings, 16th International Conference, Jan. 4-8, 2003, Piscataway, New Jersey, Jan. 4, 2003, pp. 585-590.

International search report and written opinion for application No. PCT/US2007/069481, mailed May 13, 2008, 18 pages.

DEVELOPING A HARDWARE DESCRIPTION WHICH PERFORMS A FUNCTION BY PARTIAL HARDENING OF A SOFTWARE PROGRAM ON A MULTI-PROCESSOR SYSTEM

PRIORITY CLAIM

This application is a continuation of U.S. patent application Ser. No. 13/431,029 titled "Partial Hardening of a Software Program from a Software Implementation to a Hardware Implementation", filed on Mar. 27, 2012, now U.S. Pat. No. 8,438,510, which is a continuation of U.S. patent application Ser. No. 13/110,248, titled "Converting Portions of a Software Program Executing on a Processing System to Hardware Descriptions", filed on May 18, 2011, now U.S. Pat. No. 8,171,436, which is a continuation of U.S. patent application Ser. No. 12/837,767, now U.S. Pat. No. 7,949,969, titled "Designing an ASIC Based on Execution of a Software Program on a Processing System", filed on Jul. 16, 2010, which is a continuation of U.S. patent application Ser. No. 11/751,994, now U.S. Pat. No. 7,761,817, titled "Designing an ASIC Based on Execution of a Software Program on a Processing System", filed on May 22, 2007, which claims benefit of priority from U.S. Provisional Application Ser. No. 60/802,629 titled "Electronic System Design Method from Prototype to Application Specific Integrated Circuit" filed on May 22, 2006, and which are all hereby incorporated by reference in their entirety as though fully and completely set forth herein.

FIELD OF THE INVENTION

The present invention relates to the field of application specific integrated circuit (ASIC) development, and more particularly to a system and method for designing an ASIC based on a software program.

DESCRIPTION OF THE RELATED ART

The recent trend to use a high level programming language, such as "C", to describe an electronic system for the purpose of improving functional verification efficiency has created a wider implementation gap between a high level model and low level hardware realization. Typically, in order to prototype the electronic device, the high level language programs are converted into a Hardware Description Language (HDL) description such as Verilog or VHDL code either manually or automatically, synthesized into gate level logic, and initially tested on programmable hardware devices, such as, for example, field programmable gate arrays (FPGAs). In many cases, this proves to be a complicated task as most high level programs do not contain clocking information which is required for the gate level logic implementation of configuring programmable hardware devices or ASICs.

Systems implemented with a mix of processors and hardwired logic also require a difficult step to partition the design into software (high level language programs executed by processors) and hardware (HDL description of gate level logic). As a result, manual conversion is time consuming and error prone. Automatic conversion (behavioral synthesis) often creates inefficient logic. Hardware prototypes based on off-the-shelf, commercially available programmable devices such as FPGAs and processors often operate below the desirable system speed, which may result in additional challenges for development and verification. In some cases, the code generated for configuring the programmable hardware element may deviate significantly from the code required for the final ASIC due to performance and resource constraints of the programmable hardware devices. Correspondingly, many development cycles are required to transform a design from a high level programming language based model to a final ASIC. Furthermore, there is no fool-proof analytical technique to verify the correctness (functional equivalence) of the various design transformations. Thus, improvements in the path from high level behavioral models to physical implementation for ASIC designs would be desirable.

SUMMARY OF THE INVENTION

Various embodiments of a system and method for converting a software program into an ASIC are presented below.

First, a software program may be stored. The software program may include program instructions which implement the function of a desired ASIC. In one embodiment, the software program may be written in a high-level computing language such as, for example, C. Alternatively, the software program may be written in a graphical programming language such as LabVIEW® from National Instruments or SimuLink® from The Mathworks, Inc.

The software program may be executed on a processing system capable of parallel processing. In various embodiments, the processing system may be implemented in a single chip or a plurality of coupled chips, as desired. For example, the processing system may include a plurality of processors and memory mediums (e.g., interspersed between the processors). Alternatively, or additionally, the processing system may include a plurality of reconfigurable logic elements capable of parallel execution.

Note that prior to executing the software program, the software program may be analyzed and partitioned into portions which may execute on different portions of the processing system. For example, a first task or portion of the software program may execute on a first portion of the processing system. The analysis and partitioning may be performed automatically or manually as desired. Thus, the software program may be partitioned among portions of the processing system.

Note further that the software program may be executed on the processing system at a desired system speed. For example, the software program may execute at the desired speed of the ASIC being created. Said another way, the processing system may include sufficient hardware resources to execute the software program at a throughput level equivalent to the targeted system speed. Correspondingly, system development and debugging may be performed at full system speed without compromise. Thus, the processing system may execute in real time at the desired system speed, thereby allowing the designer to fully test the software program without assumptions regarding future performance of the ASIC.

Additionally, where further processing power is required (e.g., to achieve the desired system throughput level), further processors, memories, and/or communication paths may be added to the processing system with minimal effort. The ability to rapidly scale the processing system to meet system requirements may provide rapid turnaround prototyping capability to system design. In preferred embodiments, the redistribution of the software program over the processing system may be performed automatically and transparently to the user.

Correspondingly, the software program may be validated according to the execution of the software program on the processing system. The software development environment running on a computer system may provide debugging tools, performance analysis tools, task allocation tools, and communication synthesis tools to develop and validate the system software program. The validated software may then be optimized to consume the minimum amount of processing, memory, and communication resources, which form the hardware basis for an ASIC implementation.

A first hardware description of the processing system may be stored. The first hardware description may specify an implementation of the processing system on a hardware device. For example, in one embodiment, the first hardware description may correspond to a default hardware description for the processing system described above. Alternatively, or additionally, the hardware description may be pieced together based on the components of the processing system. The first hardware description may be in a Hardware Description Language (HDL) such as, for example, VHDL (VHSIC Hardware Description Language), Verilog, etc.

A second hardware description may be generated which corresponds to a portion of the processing system specified by the first portion of the first hardware description. Following the example from above, the second hardware description may correspond to the first portion of the first hardware description. The second hardware description may specify a dedicated hardware implementation (e.g., specific logic circuitry) of a first portion of the software program executing on the portion of the processing system. In some embodiments, the second hardware description may be created based on the first hardware description and may incorporate hardware descriptions of the software (e.g., by converting the program instructions of the software into a hardware description, such as, for example, HDL code). Alternatively, the second hardware description may simply be created using the existing architecture of the processing system and the software executing on the processing system. Thus, the second hardware description may describe or implement some or all of the hardware represented by the first hardware description. However, the second hardware description may also describe or implement the software (or portion thereof) as well as the hardware executing the software, wherein the second hardware description specifies the software/hardware in the form of dedicated gates which accomplish the function of the software executing on hardware. Thus, as indicated above, the second hardware description may specify a dedicated hardware implementation of a portion of the software program executing on the processing system.

In various embodiments, the second hardware description may be generated one or more times. For example, a second hardware description may be generated for at least a subset of each component or portion of the processing system. Each of the second hardware descriptions may then be compiled together into a final hardware description for the ASIC. Alternatively, the second hardware description may be generated for the entirety of the ASIC, as desired.

Generating the second hardware description which specifies a dedicated hardware implementation of a portion of the software program executing on the processing system (or a portion thereof) may be referred to as "hardening" that portion of the software program and/or that portion of the processing system. Note that hardening may also include implementing the particular portion of the software program on the ASIC. Thus, hardening may mean that programmability may be removed or limited for that particular portion of the ASIC. Additionally, as indicated above, the second hardware description may be generated by modifying the first hardware description to include the software executing on the portion of the processing system.

Hardening particular portions of the ASIC may allow for greater performance, smaller area, and lower power consumption. Note that one or more portions of the processing system may not be hardened, thereby allowing for programmability on the final product (in this case the ASIC). Thus, the second hardware description may be generated for the final ASIC which may be fully or partially hardened, as desired. Thus, by controlling the amount of hardening, the characteristics of the resulting ASIC may range between a programmable ASIC to a custom hardwired ASIC, achieving varying degrees of improved area, performance, and power consumption. Note that the portions to be hardened may be selected by a user, e.g., using a graphical user interface (GUI) executing on the computer system.

Generating the second hardware description (or hardening) may be performed using a variety of methods. In one embodiment, generating the second hardware description may include analyzing the software executing on the processing system to determine the actual amount of hardware resources used. After performing the analysis, one or more unused communication links (e.g. logic and wiring) or chip IO may be removed, e.g., from the first hardware description to generate the second hardware description. Thus, in one embodiment, the second hardware description may not include hardware descriptions of various portions of the processing system based on the analysis.

In some embodiments, programmable communication links with critical timing requirements may be replaced with dedicated wires. Further, the width of the instruction set and/or data may be altered according to the software program.

Additionally, the size and organization of the data memory may be optimized to fit the exact requirements of the function defined by the software. For example, unnecessary memory descriptions for unused memory may be removed from the first hardware description (to generate the second hardware description) during the hardening process. Alternatively, or additionally, memory size may be increased, memory organization may be altered or RAM descriptions may be replaced with read only memory (ROM) descriptions, e.g., to allow for greater performance and smaller area of the final ASIC.

In some embodiments, the first hardware description may describe a particular processor; hardening the processor may include replacing the description of the processor (e.g., in the first hardware description) with a particular description of a processor from a library of pre-verified processor cores. For example, a processor with built-in floating point acceleration hardware may be used if the system requirements (e.g., of the ASIC) dictate floating point performance; otherwise, a smaller fixed point processor may be selected and used from the library of processor descriptions.

Similarly, the processor description may be customized and reconfigured based on the software requirements of the software program. For example, the processor description(s) may be modified by adding or removing instructions, optimizing register file and cache size, adding special hardware accelerators and addressing modes, and/or creating custom instructions, among others. In one embodiment, the execution control and the instruction memory of a processor may be replaced by a state machine executing the function of a particular software program. Additionally, the processor description may be optimized by substituting a custom datapath which substantially matches the computational requirement of the software program. The custom datapath may allow for operation to perform in parallel that had been previously executed serially, e.g., by the processing system described by the first hardware description. Note that in some embodiments, conventional behavioral synthesis techniques may be used. For example, portions of the system programs may be partitioned and synthesized into hardwired logic blocks.

In some embodiments, IP blocks may be integrated into the second hardware description and/or the final hardware description. The IP blocks may or may not have been present in the original processing system architecture. The IP blocks may also be highly optimized logic implementation of a function of the software program. IP blocks (Intellectual Property blocks) may refer to blocks generated by a company or corporation which is licensed out for use. Thus, IP blocks may be incorporated into the ASIC (e.g., by including their descriptions in the second hardware description).

After one or more portions of the ASIC are hardened, the electrical performance of the ASIC may be optimized for the new chip topology (as opposed to the original processing system's topology). Circuit optimization may include sizing, buffering, clock net tuning, power/ground net tuning, and/or other optimizations.

Thus, generating the second hardware description may include modification of the first hardware description to optimize the ASIC. The ASIC may be created or configured and may implement the function of the software program. Configuring or creating the ASIC may include implementing the second hardware description (or the final hardware configuration/plurality of second hardware configurations) on the ASIC. For example, where the hardware description for configuring the ASIC includes a state machine, configuring the ASIC may include implementing the state machine. Furthermore, configuring the ASIC may include implementing one or more portions of the first hardware description on the ASIC.

BRIEF DESCRIPTION OF THE DRAWINGS

A better understanding of the present invention can be obtained when the following detailed description of the preferred embodiment is considered in conjunction with the following drawings, in which.

Figure 1:
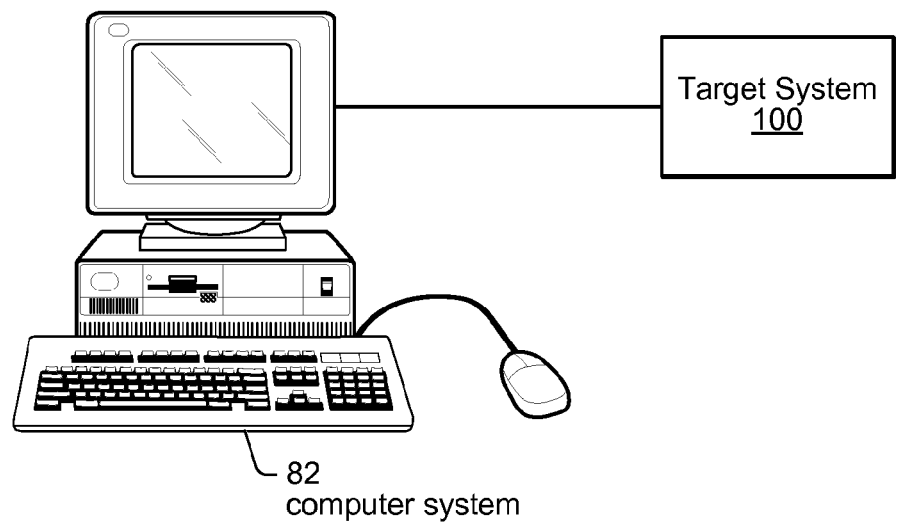
FIG. 1 illustrates an exemplary computer system controlling a target system under design to implement various embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. patent application Ser. No. 10/602,292, filed Jun. 24, 2003, titled "Processing system with interspersed processors and communication elements" whose inventors are Michael B. Doerr, William H. Hallidy, David A. Gibson and Craig M. Chase; and U.S. patent application Ser. No. 11/691,889, filed Mar. 27, 2007, titled "Programming a Multi-Processor System", whose inventors are John Mark Beardslee, Michael B. Doerr and Tommy K. Eng.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical or optical signals.

Programmable Hardware Element—includes various hardware devices comprising multiple programmable function blocks connected via a programmable or hardwired interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Application Specific Integrated Circuit (ASIC)—this term is intended to have the full breadth of its ordinary meaning The term ASIC is intended to include an integrated circuit customized for a particular application, rather than a general purpose programmable device, although ASIC may contain programmable processor cores as building blocks. Cell phone cell, MP3 player chip, and many other single-function ICs are examples of ASICs. An ASIC is usually described in a hardware description language such as Verilog or VHDL.

Program—the term "program" is intended to have the full breadth of its ordinary meaning The term "program" includes 1) a software program which may be stored in a memory and is executable by a processor or 2) a hardware configuration program useable for configuring a programmable hardware element or ASIC.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages);

assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element or ASIC.

Graphical User Interface—this term is intended to have the full breadth of its ordinary meaning The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

Graphical User Interface Element—an element of a graphical user interface, such as for providing input or displaying output. Exemplary graphical user interface elements comprise input controls and output indicators.

Computer System—any of various types of computing or processing systems, including a personal computer system (PC), mainframe computer system, workstation, network appliance, Internet appliance, personal digital assistant (PDA), grid computing system, or other device or combinations of devices. In general, the term "computer system" can be broadly defined to encompass any device (or combination of devices) having at least one processor that executes instructions from a memory medium.

FIG. 1—Computer System and ASIC

FIG. 1 illustrates a computer system 82 coupled to a target system 100 that is operable to implement various embodiments of the invention.

The computer system 82 may include at least one memory medium on which one or more computer programs or software components according to one embodiment of the present invention may be stored. For example, the memory medium may store one or more programs (e.g., software tools) which are executable to perform the methods described herein. The memory medium may also store operating system software, as well as other software for operation of the computer system. Various embodiments further include receiving or storing instructions and/or data implemented in accordance with the foregoing description upon a carrier medium.

In one embodiment, the computer system may store and execute a software development environment to control and observe the operation of the target system. The target system may include a processing system capable of executing the system software at desired performance level. The target system software program may be stored in the computer system and downloaded onto the target processing system to perform the function of the electronic system. The target system may include a dedicated ASIC implementation of the target system performing the same function as the processing system running the system software program. The computer system is primarily used during the development and verification stages. The target system may be capable of operating independently to perform the function of the electronic system without the computer system.

As shown in FIG. 1, the computer system 82 may include a display device and may be coupled to the target system 100.

The display device may be operable to display a graphical user interface (GUI) for the software development environment. The graphical user interface may comprise any type of graphical user interface, e.g., depending on the computing platform.

Figures 2A, 2B:
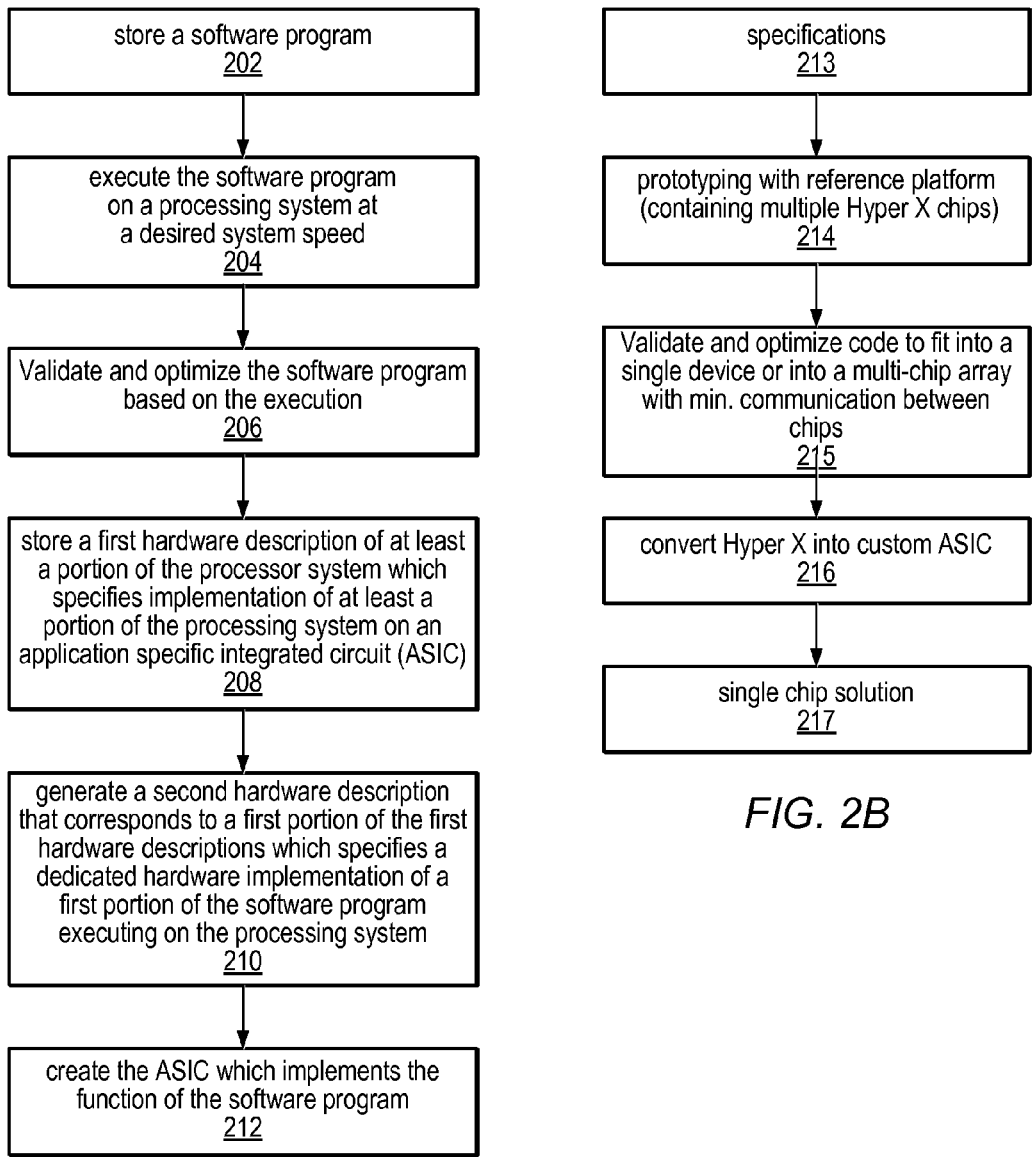
FIGS. 2A and 2B are flowcharts illustrating an exemplary embodiment of a method for designing an ASIC based on a software program according to one embodiment.

FIGS. 2A and 2B—Method for Converting a Software Program into an ASIC

In the exemplary embodiment shown in FIG. 2A, FIG. 2A illustrates a method for designing an ASIC based on a software program. FIG. 2B illustrates a particular embodiment of the method for converting a software program from the prototyping stage of the electronic system design into a production ASIC. The methods shown in FIGS. 2A and 2B may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

First, in 202, a software program may be stored. The software program may include program instructions which implement the function of a desired ASIC. In one embodiment, the software program may be written in a high-level computing language such as, for example, C. Alternatively, the software program may be written in a graphical programming language such as LabVIEW® from National Instruments or SimuLink® from The Mathworks, Inc.

Figure 3:
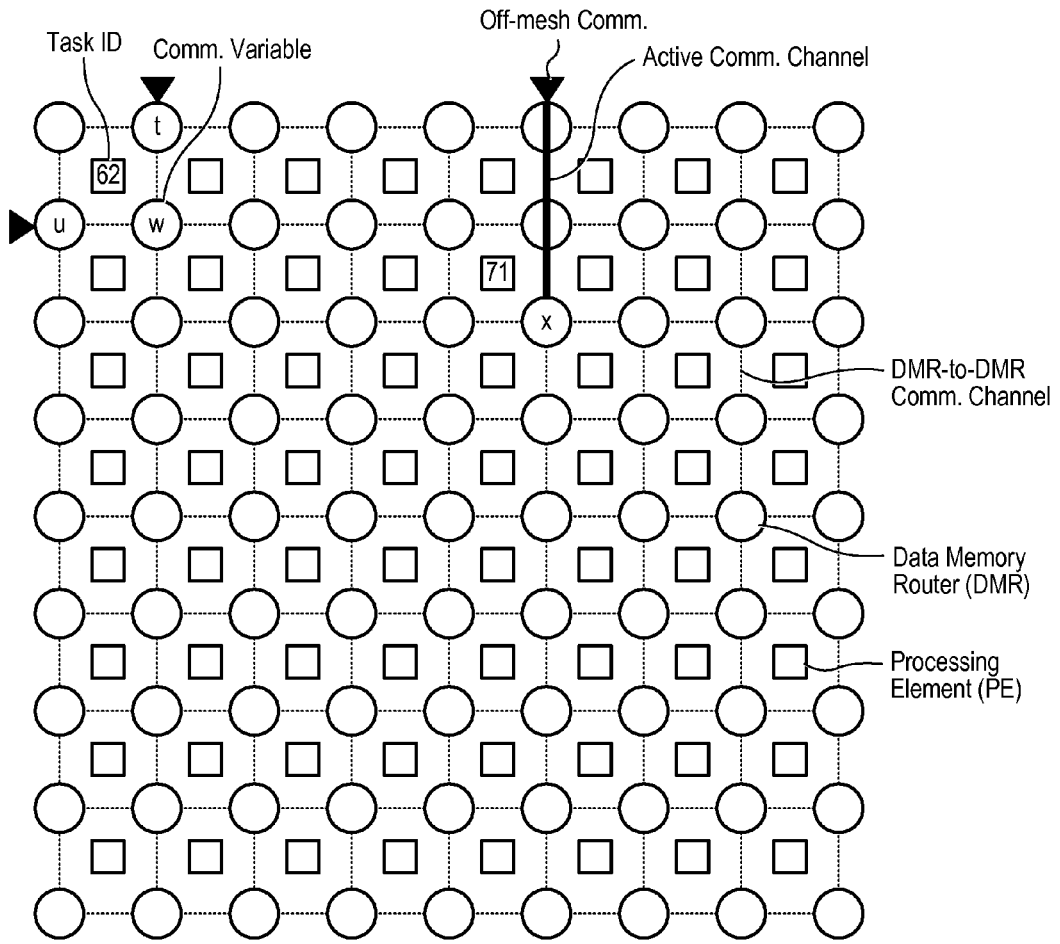
FIG. 3 illustrates an exemplary processing system according to one embodiment of the present invention.

In 204, the software program may be executed on a processing system capable of parallel processing. In various embodiments, the processing system may be implemented in a single chip or a plurality of coupled chips, as desired. For example, the processing system may include a plurality of processors and memory mediums (e.g., interspersed between the processors). Alternatively, or additionally, the processing system may include a plurality of reconfigurable logic elements capable of parallel execution. In one embodiment, the processing system may be the HyperX multiprocessor system shown in FIG. 3. Thus, the multiprocessor system may execute the software program in parallel using the plurality of processors. U.S. patent application Ser. Nos. 10/602,292 and 11/691,889, which were incorporated by reference above, describe such a system as well as execution and deployment of software programs thereon. Thus, further details regarding 202, 204, and 206 may be found in one or more of the references incorporated above. Note that the details described in these references and herein are not limiting and that other embodiments are envisioned. For example, the software program may be written in any number of languages on any number of processing systems other than those described in the cited references or described above, as desired.

Note that prior to executing the software program, the software program may be analyzed and partitioned into portions which may execute on different portions of the processing system. For example, a first task or portion of the software program may execute on a first portion of the processing system. The analysis and partitioning may be performed automatically or manually as desired. Thus, the software program may be partitioned among portions of the processing system.

Note further that the software program may be executed on the processing system at a desired system speed. For example, the software program may execute at the desired speed of the ASIC being created (e.g., in 212 described below). Said another way, the processing system may include sufficient hardware resources to execute the software program at a throughput level equivalent to the targeted system speed. Correspondingly, system development and debugging may be performed at full system speed without compromise. Thus, the processing system may execute in real time at the desired system speed, thereby allowing the designer to fully test the software program without assumptions regarding future performance of the ASIC.

Additionally, where further processing power is required (e.g., to achieve the desired system throughput level), further processors, memories, and/or communication paths may be added to the processing system with minimal effort. The ability to rapidly scale the processing system to meet system requirements in 214 may provide rapid turn around prototyping capability to system design. In preferred embodiments, the redistribution of the software program over the processing system may be performed automatically and transparently to the user.

Correspondingly, in 206, the software program may be validated according to the execution of the software program on the processing system. The software development environment running on the computer system 82 may provide debugging tools, performance analysis tools, task allocation tools, and communication synthesis tools to develop and validate the system software program. The validated software may then be optimized to consume the minimum amount of processing, memory, and communication resources in 215, which form the hardware basis for an ASIC implementation in 216.

In 208, a first hardware description of the processing system may be stored. The first hardware description may specify an implementation of the processing system on a hardware device (e.g., the HyperX chip in 214). For example, in one embodiment, the first hardware description may correspond to a default hardware description for the processing system described above. Alternatively, or additionally, the hardware description may be pieced together based on the components of the processing system. In one embodiment, there may be different hardware descriptions for the different communication links, processor types, memories, etc. of the processing system and these may be pieced together according to the particular components and/or architecture of the processing system. The first hardware description may have one or more portions which correspond to various components of the processing system. For example, the first hardware description may include a first portion which describes, in one embodiment, a processor and memory. Thus, the first hardware description may be stored according to the design of the processing system. Thus the first hardware description is such that, if the first hardware description were implemented on an ASIC, this would produce the processing system on the ASIC, i.e., the plurality of processors and memories would be implemented on the ASIC.

In 210, a second hardware description may be generated which corresponds to a portion of the processing system specified by a first portion of the first hardware description. Following the example from above, the second hardware description may correspond to the first portion of the first hardware description. The second hardware description may specify a dedicated hardware implementation of a first portion of the software program executing on the portion of the processing system. In some embodiments, the second hardware description may be created based on the first hardware description and may incorporate hardware descriptions of the software (e.g., by converting the program instructions of the software into a hardware description, such as, for example, HDL code). Alternatively, the second hardware description may simply be created using the existing architecture of the processing system and the software executing on the processing system. Thus, the second hardware description may describe or implement some or all of the hardware represented by the first hardware description. However, the second hardware description may also describe or implement the software (or portion thereof) as well as the hardware executing the software. Thus, as indicated above, the second hardware description may specify a dedicated hardware implementation of a portion of the software program executing on the processing system.

The degree of hardening that may be performed in creating portions of the second hardware description may range from a more optimized processor implementation to dedicated hardware circuitry. Thus, in one embodiment a portion of the second hardware description is a more optimized processor with more limited programmability relative to the general purpose processor specified in the first hardware description. In another embodiment, a portion of the second hardware description comprises dedicated logic such that, if this portion of the second hardware description were implemented on an ASIC, this would produce dedicated gates and/or logic circuitry on the ASIC that implement the functionality of the first portion of the software program executing on the respective portion of the processing system. Thus different portions of the second hardware description may be "hardened" to various different degrees, as required by various criteria such as size, performance, cost, etc.

As one specific example, a processor in the processing system may be programmed to calculate the product of two sums: $Z=(A+B)\times(C+D)$, where all variables are stored in a data memory. To run this program in the processing system, a program may be loaded into the instruction memory of the processor. The program may contain a sequence of instructions to fetch data (A, B, C, and D) from the data memory, activate the adder and multiplier in the execution unit of the processor to compute the result (Z), and store the result back into the data memory. In this product of sums example, the first hardware description may include a first portion which describes a processor (comprises of an execution unit and an instruction memory) and a data memory. This first hardware description may define a processor flexible enough to perform any function specified by the instructions of the program. The second hardware description may include a corresponding portion which describes dedicated circuitry, e.g., a "hardened" version of the same processor and memory to perform only the product of sums operation. Thus, in this particular example, the second hardware description may describe a dedicated hardware implementation of the portion of the software executing on the portion of the processing system (in this case, the processor and memory).

In various embodiments, the second hardware description may be generated one or more times. For example, a second hardware description may be generated for each component or portion of the processing system. Each of the second hardware descriptions may then be compiled together into a final hardware description for the ASIC. Alternatively, the second hardware description may be generated for the entirety of the ASIC, as desired.

Generating the second hardware description which specifies a dedicated hardware implementation of a portion of the software program executing on the processing system (or a portion thereof) may be referred to as "hardening" that portion of the software program and/or that portion of the processing system. Note that hardening may also include implementing the particular portion of the software program on the ASIC (e.g., by configuring the ASIC according to the second hardware description as described in 212). Thus, hardening may mean that programmability may be removed or limited for that particular portion of the ASIC, or that particular portion of the software program. Additionally, as indicated above, the second hardware description may be generated by modifying the first hardware description to include the software executing on the portion of the processing system.

Hardening particular portions of the ASIC may allow for greater performance, smaller area, and lower power consumption. Note that one or more portions of the processing system may not be hardened, thereby allowing for programmability on the final product (in this case the ASIC). Thus, the second hardware description may be generated for the final ASIC which may be fully or partially hardened, as desired. Thus, by controlling the amount of hardening, the characteristics of the resulting ASIC may range between a programmable ASIC to a custom hardwired ASIC, achieving varying degrees of improved area, performance, and power consumption. Note that the portions to be hardened may be selected by a user, e.g., using a graphical user interface (GUI) executing on the computer system 82.

Generating the second hardware description (or hardening) may be performed using a variety of methods. In one embodiment, generating the second hardware description may include analyzing the software executing on the processing system to determine the actual amount of hardware resources used. After performing the analysis, one or more unused communication links (e.g. logic and wiring) or chip IO may be removed, e.g., from the first hardware description to generate the second hardware description. Thus, in one embodiment, the second hardware description may not include hardware descriptions of various portions of the processing system based on the analysis.

In some embodiments, programmable communication links with critical timing requirements may be replaced with dedicated wires. Further, the width of the instruction set and/or data may be altered according to the software program stored in 202.

Additionally, the size and organization of the data memory may be optimized to fit the exact requirements of the function defined by the software. For example, unnecessary memory descriptions for unused memory may be removed from the first hardware description (to generate the second hardware description) during the hardening process. Alternatively, or additionally, memory size may be increased, memory organization may be altered or RAM descriptions may be replaced with read only memory (ROM) descriptions, e.g., to allow for greater performance and smaller area of the final ASIC.

In some embodiments, the first hardware description may describe a particular processor; hardening the processor may include replacing the description of the processor (e.g., in the first hardware description) with a particular description of a processor from a library of pre-verified processor cores. For example, a processor with built-in floating point acceleration hardware may be used if the system requirements (e.g., of the ASIC) dictate floating point performance; otherwise, a smaller fixed point processor may be selected and used from the library of processor descriptions.

Similarly, the processor description may be customized and reconfigured based on the software requirements of the software stored in 202. For example, the processor description(s) may be modified by adding or removing instructions, optimizing register file and cache size, adding special hardware accelerators and addressing modes, and/or creating custom instructions, among others. In one embodiment, the execution control and the instruction memory of a processor may be replaced by a state machine executing the function of a particular software program. Additionally, the processor description may be optimized by substituting a custom datapath which substantially matches the computational requirement of the software program. The custom datapath may allow for operation to perform in parallel that had been previously executed serially, e.g., by the processing system described by the first hardware description. Note that in some embodiments, conventional behavioral synthesis techniques may be used. For example, portions of the system programs may be partitioned and synthesized into hardwired logic blocks.

In some embodiments, IP blocks may be integrated into the second hardware description and/or the final hardware description. The IP blocks may or may not have been present in the original processing system architecture. The IP blocks may also be highly optimized logic implementation of a function of the software program. IP blocks (Intellectual Property blocks) may refer to blocks generated by a company or corporation which is licensed out for use. Thus, IP blocks may be incorporated into the ASIC (e.g., by including their descriptions in the second hardware description).

After one or more portions of the ASIC are hardened (and/or after the ASIC has been created or configured in 212), the electrical performance of the ASIC may be optimized for the new chip topology (as opposed to the original processing system's topology). Circuit optimization may include sizing, buffering, clock net tuning, power/ground net tuning, and/or other optimizations.

Thus, generating the second hardware description may include modification of the first hardware description to optimize the ASIC. Since the modification does not alter the function of the system, the verification techniques and tests, including formal verification techniques, may be used to verify the first hardware description may be used to verify the second hardware description.

In 212, the ASIC may be created or configured and may implement the function of the software program. Configuring or creating the ASIC may include implementing the second hardware description (or the final hardware configuration/plurality of second hardware configurations) on the ASIC. For example, where the hardware description for configuring the ASIC includes a state machine, configuring the ASIC may include implementing the state machine. Furthermore, configuring the ASIC may include implementing one or more portions of the first hardware description on the ASIC.

Figure 4:
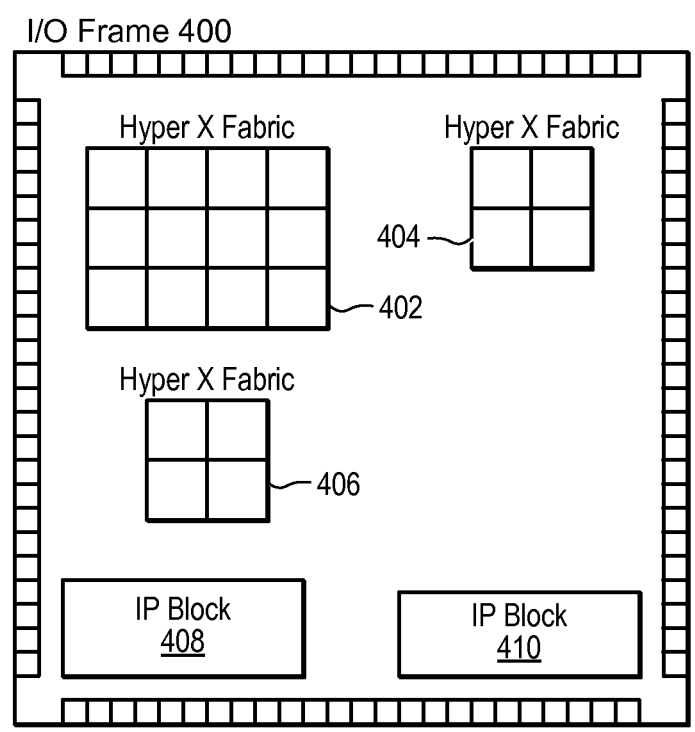
FIG. 4 illustrates an exemplary ASIC according to one embodiment of the present invention.

FIG. 4—Exemplary Application Specific Integrated Circuit (ASIC)

FIG. 4 illustrates a block diagram of an exemplary ASIC developed using the present invention. As shown, the ASIC may include one or more programmable sections, shown in FIG. 4 as Hyper X Fabric's 402, 404, and 406. The programmable part of the ASIC remains substantially similar to the original processor fabric. As indicated above, in some embodiments, the finalized ASIC may contain no programmable section at all in the case of a fully hardwired ASIC. For the hardened parts, a variety of physical implementation techniques ranging from full custom layout to standard cell place & route may be applied. The ASIC may also include I/O Frame 400 and one or more hardened IP blocks 408 and 410. The ASIC of FIG. 4 may be created according to the systems and methods described above.

Structured ASIC Design

In one embodiment, the ASIC may be created or configured using the Structured ASIC approach. Structured ASICs are special forms of ASICs with pre-determined base circuit and layout structure. Structured ASICs are aimed at reducing design time and cost by limiting customization to metal, via, or other top material layers of the chip fabrication process. Examples of structured ASIC include LSI's RapidChip, NEC's ISSP, and Fujitsu's AccelArray. Structured ASICs inherit the same risk and complexity in designing gate level logic and its associated timing convergence problem as conventional ASIC, albeit at lower mask cost and shorter fabrication time due to the use of pre-fabricated based fabric.

Current structured ASIC base fabrics are populated mostly by uncommitted gates to support metal layer customization. A description of the system, written in HDL, is required. To create/implement the ASIC, logic synthesis tools may be used convert the HDL into a gate level netlist. Correspondingly, the gates may then be placed and connected by creating custom metal masks.

Many techniques used in hardening a custom ASIC (such as those describe above, among others) apply equally well in a mask programmable structured ASIC implementation. In one embodiment of the structured ASIC implementation, the base array comprises processors, e.g., of the processor system described above, memory macros, IO, and other pre-defined IP blocks, thus creating a structured ASIC driven directly from a high level programming language, not an HDL.

In another embodiment, uncommitted gates are added to the base fabric of the processor system to facilitate the creation of custom logic. Additionally, or alternatively, metal mask customization may be used to form communication links. In one embodiment, metal layer customization may also be used to form memory blocks of various types, sizes, and organization. Furthermore, metal layer customization is used to create custom logic blocks.

In another embodiment, the characteristics of each processor (or at least a subset of the processors) in the processor system may be customized by metal layer customization. For example, one or more processors may be modified by adding/removing instructions, including/excluding floating point hardware, adjusting register file size and/or cache size, and/or including special hardware accelerators.

In some embodiments, one or more ASIC portions may be pre-defined and pre-fabricated on an ASIC chip based on the original processing fabric and may be easily customized by different interconnects on metal layers. As another example, the Structured ASIC may already include built-in IP blocks.

In another embodiment, when a structured ASIC is used, the processing system used to validate the software program may be a software or hardware emulator of the structured ASIC. By developing the software program on a platform substantially similar to the final structured ASIC, the mapping from the software program to the structured ASIC is simplified. Due to the reduced hardening possibilities available on a structure ASIC, the first hardware description may not contain the full implementation of the processing system since the same processing hardware is already pre-fabricated on the structure ASIC. In such case, the second hardware description may only contain information needed to customize communication, although varying degrees of hardening is still possible with a structured ASIC approach.

Automation of the Hardening Process

As indicated above, various software tools may be stored on the computer system 82 for assisting and automating the hardening process described above in FIGS. 2A and 2B. The following describes specific embodiments of exemplary tools that may be used.

Software Development—to enter, visualize, simulate, and debug user programs. These tools may include facilities to connect to hardware reference design for software/hardware co-design and debug.

Software Analysis—to analyze computing resource usage, storage resource usage, communication resource usage, IO resource usage, dataflow, and data traffic.

Task Allocation—to model the cost function of processing, memory access, and communication overhead. These tools may allocate tasks and distribute work load to different processors to achieve optimal balance between processing and communication as well as optimal area, performance, latency, and power consumption.

Virtual Prototyping—to optimize the design based on the actual resource requirements of the software and provide rapid area/performance/power feedback to users in "what-if" analysis. Examples of silicon virtual prototyping techniques can be found in U.S. Pat. No. 6,145,117 which is hereby incorporated by reference as if fully and completely set forth herein.

Memory Generation—to generate memory of various sizes and organization to implement the decision of the optimization process.

Communication Synthesis—to generate optimal communication path between blocks on the chip to implement the decision of the optimization process.

I/O Synthesis—to generate optimal IO frame to fit the exact requirement of the system.

Custom Datapath Synthesis—to generate a customized datapath to replace the generic data processing unit of the HyperX processor.

Automatic Floorplan Creation—to generate an optimized floorplan based on timing, power, routing congestion, and signal integrity analysis. The floorplanner may integrate hard blocks, soft blocks, clock net, power/ground network, IO, and design constraints into a seed floorplan suitable for commercial physical implementation tools such as tools from Cadence and Synopsys.

Timing Optimization—to optimize electrical performance of the circuit to meet new timing constraints as a result of hardening the processor.

Design Verification—to verify the functional correctness of the hardened design. These tools may assist in verifying that the design intent has not been altered inadvertently throughout the physical transformation process.

Behavioral Synthesis—to synthesize the high level program code of the processor into a HDL description for hardwired logic implementation. Examples of commercial behavioral synthesis tools include software from Mentor Graphics, Forte Design Systems, and Synforna.

State-machine Generation—to generate state machines to replace the instruction memory, instruction execution, and sequencing logic of the processor.

Reconfigurable Processor Generation—to reconfigure the processor based on the software requirements, e.g., of the software program described above. For example, adding/removing instruction, optimizing register file and cache size, adding special hardware accelerators, and creating custom instructions are well known techniques in processor customization. Tensilica's configurable processor architecture is an example of commercial tools used to build reconfigurable processors.

Thus, one or more of the above-described software tools may be used to automate or assist in creating the ASIC using the systems and methods described herein. Note that these tools are exemplary only and that other tools are envisioned.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method for developing a hardware description which performs a function, the method comprising:
    storing a software program comprising program instructions which implement the function;
    storing a first hardware description of at least a portion of a multi-processor system, wherein the first hardware description specifies implementation of the at least a portion of the multi-processor system;
    generating a second hardware description based at least in part on the first hardware description, wherein said generating the second hardware description comprises generating a first portion and a second portion, wherein the first portion specifies a dedicated hardware implementation of a first portion of the software program executing on a first portion of the multi-processor system, and wherein the second portion specifies implementation of a second portion of the multi-processor system;
    wherein the second hardware description is configured to be implemented on an integrated circuit such that the integrated circuit implements the function.

2. The method of claim 1,
    wherein said generating the second hardware description is performed a plurality of times.

3. The method of claim 1,
    wherein said generating the first portion of the second hardware description comprises converting program instructions of the first portion of the software program into respective hardware descriptions.

4. The method of claim 1,
    wherein said generating the second hardware description comprises generating a plurality of first portions, wherein different ones of the first portions have different degrees of hardening.

5. The method of claim 1,
    wherein the first hardware description specifies at least one general purpose processor;
    wherein at least a part of the first portion of the second hardware description describes a more optimized processor with more limited programmability relative to the general purpose processor specified in the first hardware description.

6. The method of claim 1,
    wherein said generating the first portion of the second hardware description comprises analyzing a first portion of the software program executing on the first portion of the processing system to determine an amount of hardware resources used.

7. The method of claim 1,
    wherein said generating the first portion of the second hardware description comprises removing chip input/output.

8. The method of claim 1,
    wherein a first portion of the first hardware description comprises programmable communication links with critical timing requirements;
    wherein said generating the first portion of the second hardware description comprises replacing the programmable communication links with critical timing requirements with dedicated wires.

9. The method of claim 1,
    wherein said generating the first portion of the second hardware description comprises removing unnecessary memory descriptions for unused memory.

10. The method of claim 1,
    wherein the first hardware description specifies a hardware description of the processing system having a first processor type;
    wherein the second portion of the second hardware description is generated according to a second processor type.

11. A non-transitory, computer accessible memory medium storing program instructions for developing a hardware description which implements a function, wherein the program instructions are executable by a processor to:
    store a software program which implements the function;
    store a first hardware description of at least a portion of a multi-processor system, wherein the first hardware description specifies implementation of the at least a portion of the multi-processor system;
    generate a second hardware description that corresponds to the first hardware description, wherein the second hardware description comprises a first portion and a second portion, wherein the first portion specifies a dedicated hardware implementation of a first portion of the software program executing on a first portion of the processing system, and wherein the second portion specifies implementation of a second portion of the processing system;
    wherein the second hardware description is configured to be implemented on an integrated circuit such that the integrated circuit implements the function.

12. The non-transitory computer accessible memory medium of claim 11,
    wherein the program instructions are executable to generate the second hardware description a plurality of times.

13. The non-transitory computer accessible memory medium of claim 11,
    wherein generation of the first portion of the second hardware description comprises incorporating hardware descriptions of the software program.

14. The non-transitory computer accessible memory medium of claim 11,
    wherein generation of the second hardware description comprises generating a plurality of first portions, wherein different ones of the first portions have different degrees of hardening.

15. The non-transitory computer accessible memory medium of claim 11,
    wherein said generating the first portion of the second hardware description comprises analyzing the first portion of the software program executing on the first portion of the processing system to determine an amount of hardware resources used.

16. The non-transitory computer accessible memory medium of claim 11,
    wherein said generating the first portion of the second hardware description comprises removing chip input/output.

17. The non-transitory computer accessible memory medium of claim 11,
    wherein the first portion of the first hardware description comprises programmable communication links with critical timing requirements;
    wherein said generating the first portion of the second hardware description comprises replacing the programmable communication links with critical timing requirements with dedicated wires.

18. The non-transitory computer accessible memory medium of claim 11, wherein said generating the first portion of the second hardware description comprises removing unnecessary memory descriptions for unused memory.

19. The non-transitory computer accessible memory medium of claim 11,
wherein said generating the first portion of the second hardware description comprises adjusting a memory size in the second hardware description.

20. The non-transitory computer accessible memory medium of claim 11,
wherein the first hardware description specifies a hardware description of the processing system having a first processor type;
wherein the second portion of the second hardware description is generated according to a second processor type.

21. A method for developing a hardware description which performs a function, the method comprising:
storing a software program comprising program instructions which implement the function;
storing a first hardware description of at least a portion of a multi-processor system, wherein the first hardware description specifies implementation of the at least a portion of the multi-processor system;
generating a second hardware description that corresponds to a first portion of the first hardware description, wherein the second hardware description specifies a dedicated hardware implementation of a first portion of the software program executing on a first portion of the multi-processor system;
wherein the second hardware description and a second portion of the first hardware description are configured to be implemented on an integrated circuit such that the integrated circuit implements the function.

22. A non-transitory, computer accessible memory medium storing program instructions for developing a hardware description which implements a function, wherein the program instructions are executable by a processor to:
store a software program on a multi-processor system, wherein the software program implements the function;
store a first hardware description of at least a portion of the multi-processor system, wherein the first hardware description specifies implementation of the at least a portion of the multi-processor system;
generate a second hardware description that corresponds to a first portion of the first hardware description, wherein the second hardware description specifies a dedicated hardware implementation of a first portion of the software program executing on a first portion of the multi-processor system;
wherein the second hardware description and a second portion of the first hardware description are configured to be implemented on an integrated circuit such that the integrated circuit implements the function.

23. A method for developing a hardware description which performs a function, the method comprising:
storing a software program comprising program instructions which implement the function;
storing a first hardware description of at least a portion of a multi-processor system, wherein the first hardware description specifies implementation of the at least a portion of the multi-processor system;
generating a second hardware description that corresponds to the first hardware description, wherein said generating the second hardware description comprises generating a dedicated hardware implementation of the software program executing on the multi-processor system;
wherein the second hardware description is configured to be implemented on an integrated circuit such that the integrated circuit implements the function.

24. The method of claim 23,
wherein said generating the second hardware description is performed a plurality of times.

25. The method of claim 23,
wherein said generating the second hardware description comprises converting program instructions of the software program into respective hardware descriptions.

26. The method of claim 23,
wherein said generating the second hardware description comprises analyzing the software program executing on the first portion of the processing system to determine an amount of hardware resources used.

27. The method of claim 23,
wherein said generating the second hardware description comprises removing chip input/output.

28. The method of claim 23,
wherein the first hardware description comprises programmable communication links with critical timing requirements;
wherein said generating the second hardware description comprises replacing the programmable communication links with critical timing requirements with dedicated wires.

29. A non-transitory, computer accessible memory medium storing program instructions for developing a hardware description which implements a function, wherein the program instructions are executable by a processor to:
store a software program on a multi-processor system, wherein the software program implements the function;
store a first hardware description of at least a portion of the multi-processor system, wherein the first hardware description specifies implementation of the at least a portion of the multi-processor system;
generate a second hardware description that corresponds to the first hardware description, wherein the second hardware description specifies a dedicated hardware implementation of the software program executing on at least a first portion of the multi-processor system;
wherein the second hardware description is configured to be implemented on an integrated circuit such that the integrated circuit implements the function.

30. The non-transitory computer accessible memory medium of claim 29,
wherein the program instructions are executable to generate the second hardware description a plurality of times.

31. The non-transitory computer accessible memory medium of claim 29,
wherein generation of the second hardware description comprises incorporating hardware descriptions of the software program.

* * * * *